United States Patent
Keeth

(10) Patent No.: US 6,567,288 B2
(45) Date of Patent: *May 20, 2003

(54) METHODS FOR BI-LEVEL DIGIT LINE ARCHITECTURE FOR HIGH DENSITY DRAMS

(75) Inventor: Brent Keeth, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/155,132

(22) Filed: May 23, 2002

(65) Prior Publication Data

US 2002/0141220 A1 Oct. 3, 2002

Related U.S. Application Data

(63) Continuation of application No. 09/941,201, filed on Aug. 28, 2001, now Pat. No. 6,456,518, which is a division of application No. 09/533,353, filed on Mar. 23, 2000, now Pat. No. 6,429,529, which is a continuation of application No. 09/211,662, filed on Dec. 15, 1998, now Pat. No. 6,084,307, which is a continuation of application No. 08/950,471, filed on Oct. 15, 1997, now Pat. No. 5,864,181, which is a continuation of application No. 08/442,264, filed on May 15, 1995, now abandoned, which is a continuation of application No. 08/123,027, filed on Sep. 15, 1993, now abandoned.

(51) Int. Cl.$^7$ .................................................. G11C 5/02
(52) U.S. Cl. .......................... 365/51; 365/63; 257/907; 257/908
(58) Field of Search ..................... 365/51, 63; 257/776, 257/907, 908

(56) References Cited

U.S. PATENT DOCUMENTS

| | | |
|---|---|---|
| 4,536,947 A | 8/1985 | Bohr et al. |
| 4,742,018 A | 5/1988 | Kimura et al. |
| 4,914,502 A | 4/1990 | Lebowitz et al. |

(List continued on next page.)

FOREIGN PATENT DOCUMENTS

| | | |
|---|---|---|
| DE | 4433695 | 3/1995 |
| EP | 0078338 | 5/1983 |
| JP | 60-258795 | 12/1984 |
| JP | 3-174765 | 7/1991 |

OTHER PUBLICATIONS

Ahn et al., "Bidirectional Matched Global Bit Line Scheme for High Density DRAMS", (Abstract), pps. 91–92.

Hamada et al., "A Split–Level Diagonal Bit–Line (SLDB) Stacked Capacitor Cell for 256MbDRAMs", IEEE, Apr.; 1992, pps. 799–802.

Hidaka et al., "A Divided/Shared Bit–Line Sensing Scheme for ULSI DRAM Cores", Journal of Solid–State Circuit, vol. 26, No. 4, Apr. 1991, pps. 473–477.

IBM Technical Disclosure Bulletin, vol. 30, No. 3, Aug. 1987, pps. 1314–1315.

IBM Technical Disclosure Bulletin, vol. 30, No. 11, Apr. 1988, pps. 246–248.

(List continued on next page.)

Primary Examiner—Son T. Dinh
(74) Attorney, Agent, or Firm—TraskBritt

(57) ABSTRACT

There is a bi-level bit line architecture. Specifically, there is a DRAM memory cell and cell array that allows for six square feature area ($6F^2$) cell sizes and avoids the signal to noise problems. Uniquely, the digit lines are designed to lie on top of each other like a double decker overpass road. Additionally, this design allows each digit line to be routed on both conductor layers, for equal lengths of the array, to provide balanced impedance. Now noise will appear as a common mode noise on both lines, and not as differential mode noise that would degrade the sensing operation. Furthermore, digit to digit coupling is nearly eliminated because of the twist design.

8 Claims, 7 Drawing Sheets

U.S. PATENT DOCUMENTS

| | | |
|---|---|---|
| 4,922,460 A | 5/1990 | Furutani et al. |
| 4,967,396 A | 10/1990 | Kajigaya et al. |
| 4,970,564 A | 11/1990 | Kimura et al. |
| 5,014,110 A | 5/1991 | Satoh |
| 5,107,459 A | 4/1992 | Chu et al. |
| 5,138,412 A | 8/1992 | Hieda et al. |
| 5,170,243 A | 12/1992 | Dhong et al. |
| 5,206,183 A | 4/1993 | Dennison |
| 5,208,180 A | 5/1993 | Gonzalez |
| 5,243,558 A | 9/1993 | Saeki |
| 5,280,443 A | 1/1994 | Hidaka et al. |
| 5,315,542 A | 5/1994 | Melzner |
| 5,396,450 A | 3/1995 | Takashima et al. |
| 5,396,451 A | 3/1995 | Ema |
| 5,499,205 A | 3/1996 | Ahn et al. |
| 5,534,732 A | 7/1996 | DeBrosse et al. |
| 5,581,126 A | 12/1996 | Moench |
| 5,625,234 A | 4/1997 | Suzuki et al. |
| 5,670,815 A | 9/1997 | Childs et al. |
| 5,680,347 A | 10/1997 | Takeuchi et al. |
| 5,815,428 A | 9/1998 | Tsuruda et al. |
| 5,838,038 A | 11/1998 | Takashima et al. |
| 5,864,181 A | 1/1999 | Keeth |
| 5,877,976 A | 3/1999 | Lattimore et al. |
| 5,940,321 A | 8/1999 | Takeuchi et al. |
| 5,949,698 A | 9/1999 | Shirley |
| 6,005,265 A | 12/1999 | Kuroda |
| 6,018,172 A | 1/2000 | Hidaka et al. |
| 6,034,879 A | 3/2000 | Min et al. |
| 6,043,562 A | 3/2000 | Keeth |
| 6,084,307 A | 7/2000 | Keeth |
| 6,094,370 A | 7/2000 | Takashima |
| 6,185,123 B1 | 2/2001 | Allen et al. |
| 6,188,598 B1 | 2/2001 | Mueller et al. |
| 6,222,275 B1 | 4/2001 | Keeth |
| 6,243,311 B1 | 6/2001 | Keeth |
| 6,259,621 B1 | 7/2001 | Li et al. |

OTHER PUBLICATIONS

Inoue et al., "A 16Mb DRAM with An Open Bit–Line Architecture", International Solid State Circuits Conference, IEEE, 1988, pps. 246–247.

Kimura et al., "A Block–Oriented RAM with Half–Sized DRAM Cell and Quasi–Folded Data–Line Architecture", Nov. 11, 1991, IEEE, Journal of Solid–State Circuit, pps. 1511–1518.

Takashima et al., "Open/Folded Bit–Line Arrangement for Ultra High–Density DRAMs", (Abstract), pps. 89–90.

METHODS FOR BI-LEVEL DIGIT LINE ARCHITECTURE FOR HIGH DENSITY DRAMS

CROSS-REFERENCE TO RELATED APPLICATIONS

This application is a continuation of application Ser. No. 09/941,201, filed Aug. 28, 2001, now U.S. Pat. No. 6,456,518 B1, issued Sep. 24, 2002, which is a divisional of application Ser. No. 09/533,353, filed Mar. 23, 2000, now U.S. Pat. No. 6,429,529 B1, issued Aug. 6, 2002, which is a continuation of application Ser. No. 09/211,662, filed Dec. 15, 1998, now U.S. Pat. No. 6,084,307, issued Jul. 4, 2000, which is a continuation of application Ser. No. 08/950,471, filed Oct. 15, 1997, now U.S. Pat. No. 5,864,181, issued Jan. 26, 1999, which is a continuation of application Ser. No. 08/442,264, filed May 15, 1995, abandoned, which is a continuation of application Ser. No. 08/123,027, filed Sep. 15, 1993, abandoned.

FIELD OF THE INVENTION

The present invention relates to integrated circuits (ICs). Particularly, there is a RAM device where digit and digit bar, defined as a pair, are laid out vertically (in the z-axis) to each other, whereas the pairs of digit lines are laid out to be parallel (in the x or y axis) to each other. Additionally, the vertically aligned digit line pairs allow usage of memory cells having a six square feature area ($6F^2$) or less, where F is defined as the minimum realizable photolithographic process dimension feature size.

BACKGROUND OF THE INVENTION

Dynamic random access memory (DRAM) production in the early days resulted in large chips. Manufacturing of these chips, at first, was not concerned with shrinking every part down to its smallest size. At this time the open memory array was the standard design: true digit lines on one side and complement digit (also known as digit bar or digit*) lines on the opposite side, with sense amps in the middle. However, once the DRAMS reached the 256K memory density, shrinking of all features became important.

However, to push to even higher densities, like a one Megabit density, the open architecture proved to be inadequate because of the poorer signal-to-noise problem. As a result, the folded bit line architecture was developed. Yet, to use this architecture, the original memory cell from the open architecture could not be used. Thus, new cells were designed. There resulted a memory cell with a minimum size of eight square feature area ($8F^2$). The folded architecture eliminated the signal to noise problems. Thus, further shrinkage of the other components on the DRAM resulted in an overall smaller DRAM package.

Problem

For some time now, there have been many ways developed to shrink the die size. However, a new shrinkage barrier has been reached as designs approach densities of 16 and 64 Meg chips. Every aspect of the die now has to be designed with minimal size. Thus, it is now necessary to shrink the previously acceptable eight square feature area ($8F^2$) cells. Cell sizes of six square feature area ($6F^2$) to four square feature area ($4F^2$) are now needed. As a result, customers now need memory cells of six square feature area ($6F^2$) or smaller that will also avoid the previous signal to noise ratio problems.

Note, the above-described problem, as well as other problems, is solved through the subject invention and will become more apparent, to one skilled in the art, from the detailed description of the subject invention.

BRIEF SUMMARY OF THE INVENTION

One skilled in the art will appreciate the advantage of the bi-level bit line architecture. Specifically, there is a DRAM memory cell and cell array that allows for six square feature area ($6F^2$) cell sizes and avoids the signal to noise problems. Uniquely, the digit lines are designed to lay on top of each other like a double decker overpass road. Additionally, this design allows routing of digit lines on both conductor layers, for equal lengths of the array, to provide balanced impedance. Now noise will appear as a common mode noise on both lines, and not as differential mode noise that would degrade the sensing operation. Furthermore, digit to digit coupling is nearly eliminated because of the twist design.

To achieve the digit line switching, several modes of vertical twisting were developed. For a given section of the array, the twists are alternated between adjacent digit line pairs such that the overall twist resembles the traditional folded digit line twist. This twisting of the lines ensures that the signal to noise ratio of the bi-level digit line architecture can be as good as or may be even better than the folded digit line.

Other features and advantages of the present invention may become more clear from the following detailed description of the invention, taken in conjunction with the accompanying drawings and claims, or may be learned by the practice of the invention.

Figure 1:
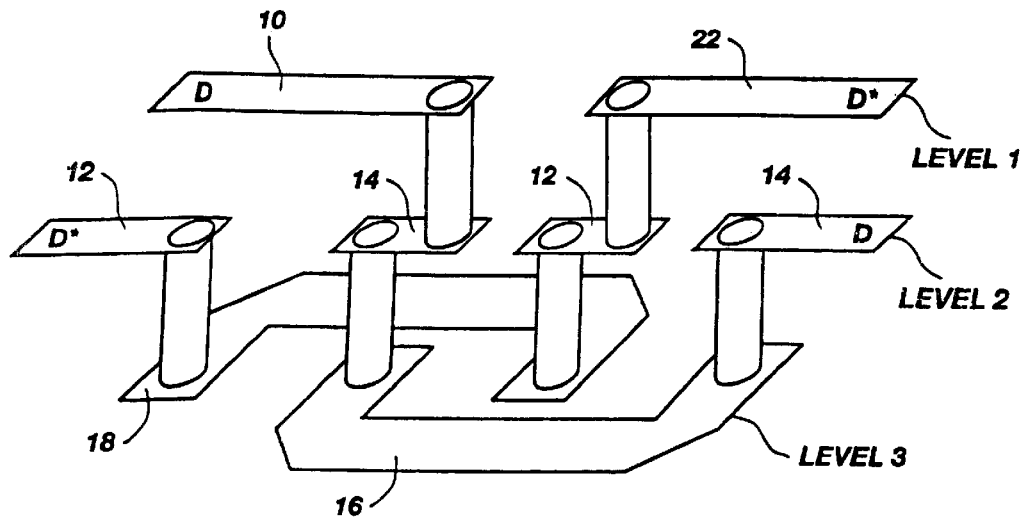
FIG. 1 is an illustration of one embodiment of the invention.

It is noted that the drawings of the invention are not to scale. The drawings are merely schematic representations, and not intended to portray specific parameters of the invention. The drawings are intended to depict only typical embodiments of the invention and are, therefore, not to be considered limiting of its scope. The invention will be described with additional specificity and detail through the use of the accompanying drawings, specification, and claims. Additionally, like numbering in the drawings represents like elements within and between drawings.

DETAILED DESCRIPTION OF THE INVENTION

Incorporated Material

The following U.S. patents are herein incorporated by reference for pertinent and supporting information:

U.S. Pat. No. 5,208,180, is a method of forming a capacitor.

U.S. Pat. No. 5,206,183, is a method of forming a bit line over a capacitor array of memory cells.

U.S. Pat. No. 5,138,412, is a dynamic RAM having an improved large capacitance.

U.S. Pat. No. 4,742,018, is a process for producing memory cells having stacked capacitors.

U.S. Pat. No. 4,970,564, is a semiconductor memory device having stacked capacitor cells.

U.S. Pat. No. 4,536,947, is a CMOS process for fabricating integrated circuits, particularly dynamic memory cells with storage capacitors.

General Embodiment

One skilled in the DRAM semiconductor memory cell history and art will easily understand the operation of this Bi-Level Digit line design using an open architecture memory cell of six square feature area ($6F^2$) or smaller feature size and switching of the digit line levels to eliminate the signal to noise ratio problems of the past.

This invention provides a new architecture for a dynamic random access memory (DRAM). The memory is characterized as having a plurality of digit line pairs, with each digit line pair consisting of both a true digit line and a complement digit line. Both digit lines of each digit line pair are electrically insulated from one another by a dielectric layer and vertically aligned along a major portion of their lengths. At one or more positions along their lengths, their positions with respect to one another are reversed. In other words, if the true digit line is initially on top during a first portion of the full length of the pair, the complement digit line is on the bottom and makes contact to a plurality of cells by means of digit line contacts. Using one of the twisting techniques depicted in FIGS. 1 to 4, the complement digit line is brought to the uppermost position while the true digit line is brought to the lowermost position.

Figure 7:
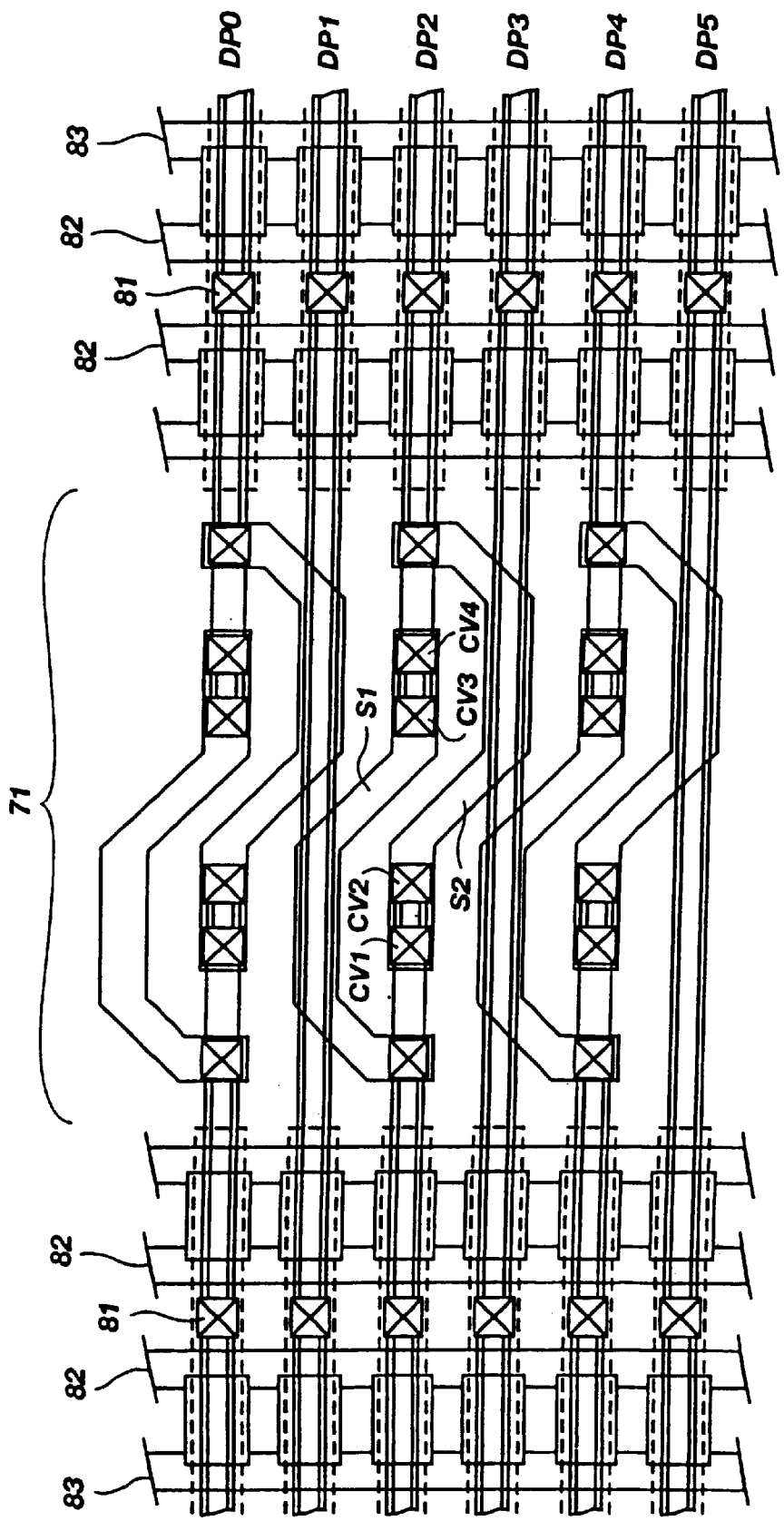
FIG. 7 is a suggested layout for a portion of a DRAM memory array having twisted double-layer digit line pairs.

Further illustrated in FIG. 7 are isolation gates/lines 83 which keep the two adjacent memory cells from biasing each other. Such isolation gates/lines 83 are grounded and are formed of polysilicon and/or other material, such as an insulator material. By having such isolation gates/lines 83 grounded, the adjacent memory cells may be more effectively prevented from biasing each other during operation while having higher potentials applied thereto.

Figure 8:
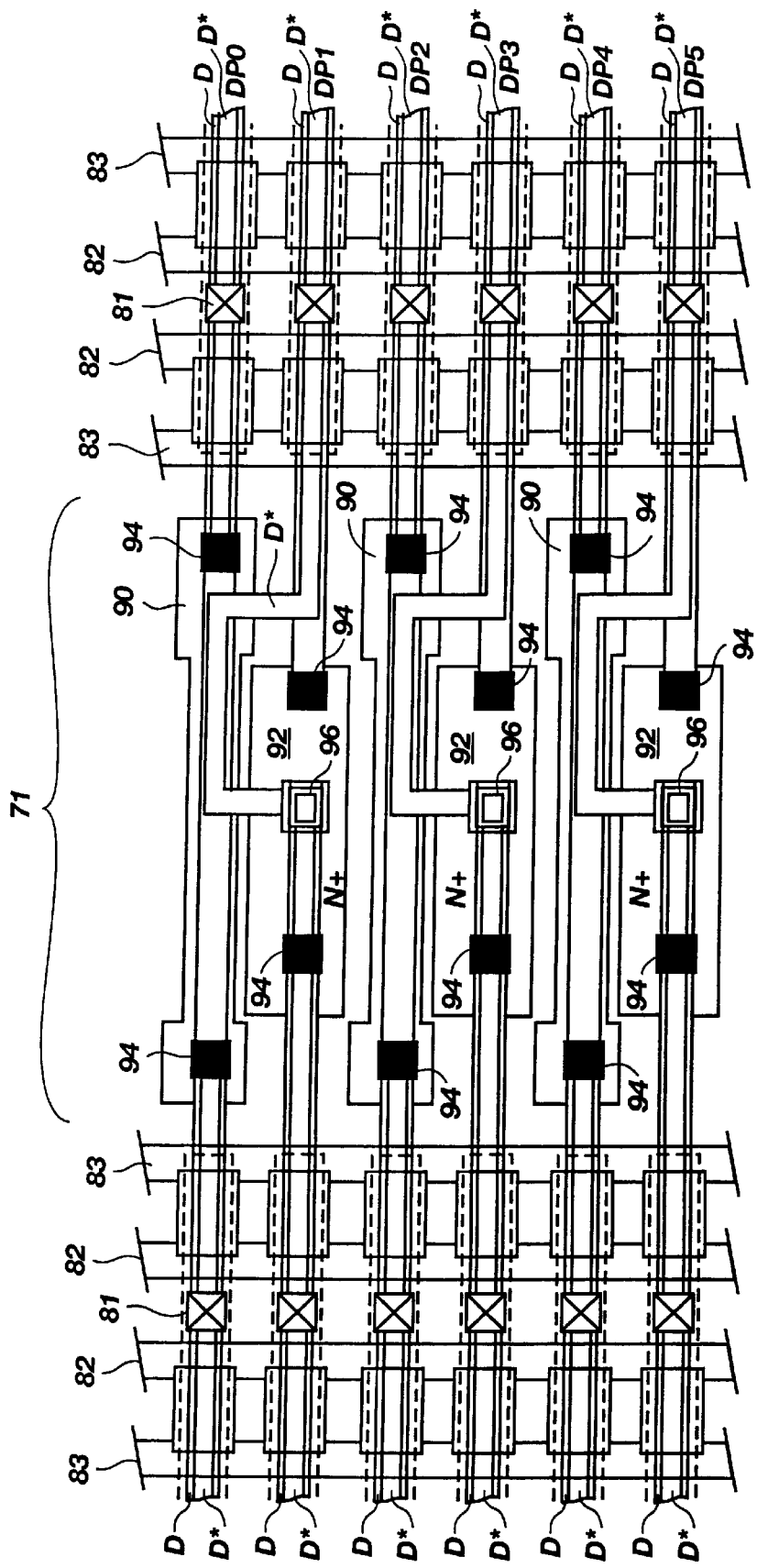
FIG. 8 is an alternative suggested layout for a portion of a DRAM memory array having twisted double-layer digit line pairs.

Referring to drawing FIG. 8, an alternative embodiment of the digit line switching, using vertical twisting, is illustrated. As illustrated, with respect to digit line pair DPO including upper digit line D* and lower digit line D, both metal digit lines, the right-hand portion of upper digit line D* is connected by means of right standard contact 94 to polysilicon area 90 and connected by means of left standard contact 94 from the polysilicon area 90 to the left-hand portion of upper digit line D* while lower digit line D is insulated from the polysilicon area 90 passing thereabove and thereover. When considering digit line pair DP1, upper digit line D* extends to cross or to overlie a portion of lower digit line D of digit line pair DPO, extends to bit contact 96, and extends over left standard contact 94, being insulated therefrom at the upper level of the digit line pair DP1 of the array while the right-hand portion of lower digit line D of the digit line pair DP1 extends to right standard contact 94, in turn, connected to N+ active area 92, in turn, being connected by left standard contact 94 to the left-hand portion of the lower digit line D of the digit line pair DP1. In each instance, when considering the right standard contact 94, prior to such contact, both digit lines D* and D are located vertically with respect to each other prior thereto in the array and when considering the left standard contact 94, from thereon both digit lines D* and D are located vertically with respect to each other in the array. Furthermore, the pattern for the arrangement of the digit lines is repeated with respect to digit line pairs DP2, DP3, DP4, and DP5 as described herein. In this manner, the noise is balanced through the use of vertical twists of the digit line pairs and the use of polysilicon areas and active N+ areas of the array. Additionally illustrated and described herein are grounded gate isolation areas 83, word lines 82, and bit line contacts 81.

FIG. 1 illustrates one embodiment of the vertical three-level downward twist design to achieve equal bit line lengths on the top and bottom of the design. As illustrated, on the left side of the figure, D (digit) line 10 (also referred to as "plane 10") is located directly above D* (D bar) line 12 (also referred to as "plane 12"). It is noted that D line 10 drops down to a first plane 14, then to a third plane 16, and is routed around the D* line 12 and then elevated back up to the first plane 14. At the second level, D line 10 has achieved a twist in the vertical direction or Z-axis. A similar vertical rotation occurs for D* line 12, except it drops down only one level to plane 18 and proceeds around the third plane 16 location and then elevates to a same plane 12, and then to plane 22, where it will remain until the next twist is encountered.

It is noted that planes 10 and 22 are on the same level, as well as planes 12 and 14, and planes 16 and 18, respectively. It also is noted that all of the twisting is relatively in a z direction and that at only two points does the twisting require additional X-Y plane real-estate, that being on levels 18 and 16.

Figure 2:
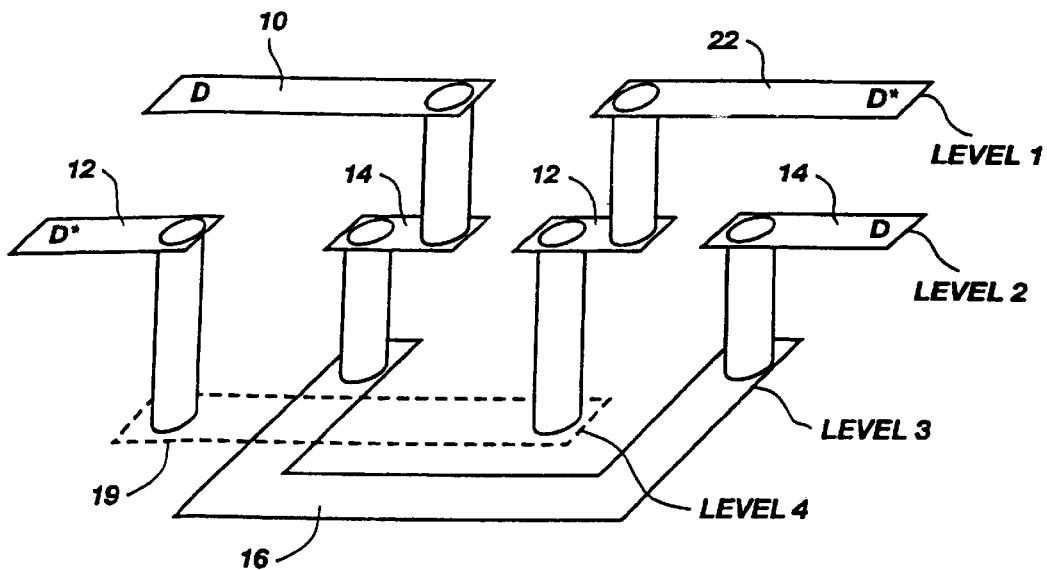
FIG. 2 is an illustration of one embodiment of the invention.

Review of FIG. 2 shows almost an identical twist. However, there are four levels in this twist. Level 4, or plane 19, is located below level 3 and plane 16. Level 4 could be any material, like substrate implant, polysilicon, metal 1, etc., the key factor being that planes 19 and 16 don't create a transistor. A variation of this design is to have plane 19 arranged like plane 18 in FIG. 1 to avoid a transistor if the material would create such.

Figure 3:
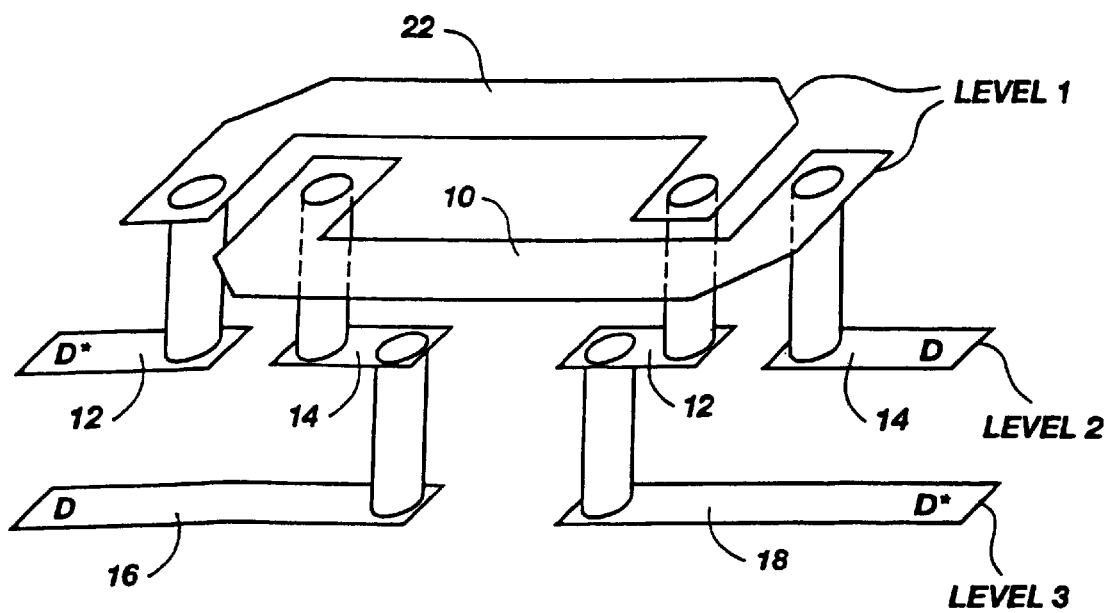
FIG. 3 is an illustration of one embodiment of the invention.

Review of FIG. 3 illustrates a three-level twist-up architecture. As illustrated, the two digit lines are on the bottom planes 12, 14, 16 and 18, whereas the twisting takes place on the upper planes 10 and 22. Again, all the planes are in a vertical orientation to one another. However, planes 10 and 22 do project out into the X-Y planes to accomplish the twist.

Figure 4:
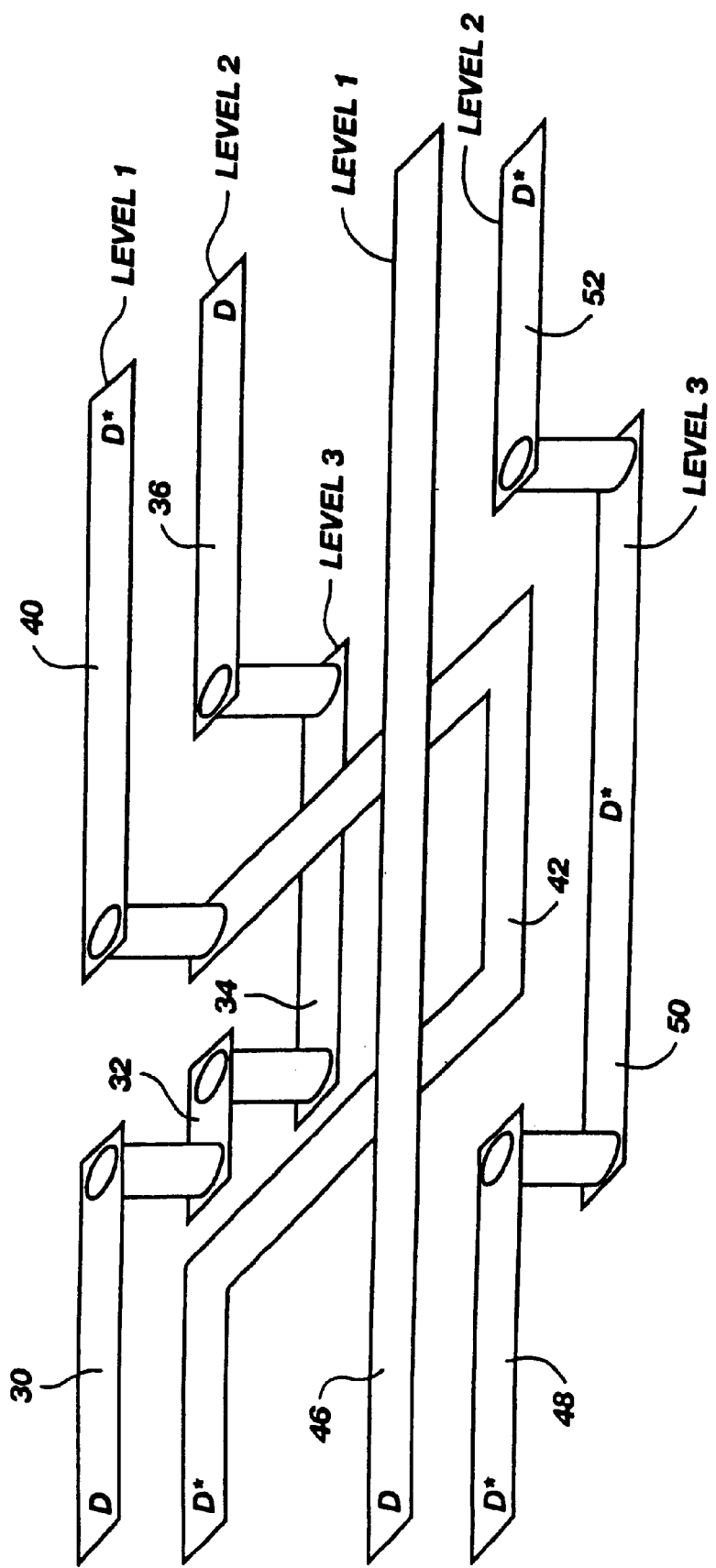
FIG. 4 is an illustration of one embodiment of the invention.

Review of FIG. 4 illustrates a four-level downward twist. Digit line (D) 30 is moved down one level via planes 32, 34, and 36 while digit bar (D*) is twisted upward via planes 42 to 40. It is noted that plane or line 42 is the only plane to extend in the X-Y plane, and, in fact, it extends into the vertical plane of an adjoining pair of digit lines. To accommodate this extension, the bottom line 48 of D* is moved to a fourth lower level or plane 50, and then brought back up to line 52, while digit line 46 has no need to be repositioned since it is elevated above the plane 42.

Figure 5:
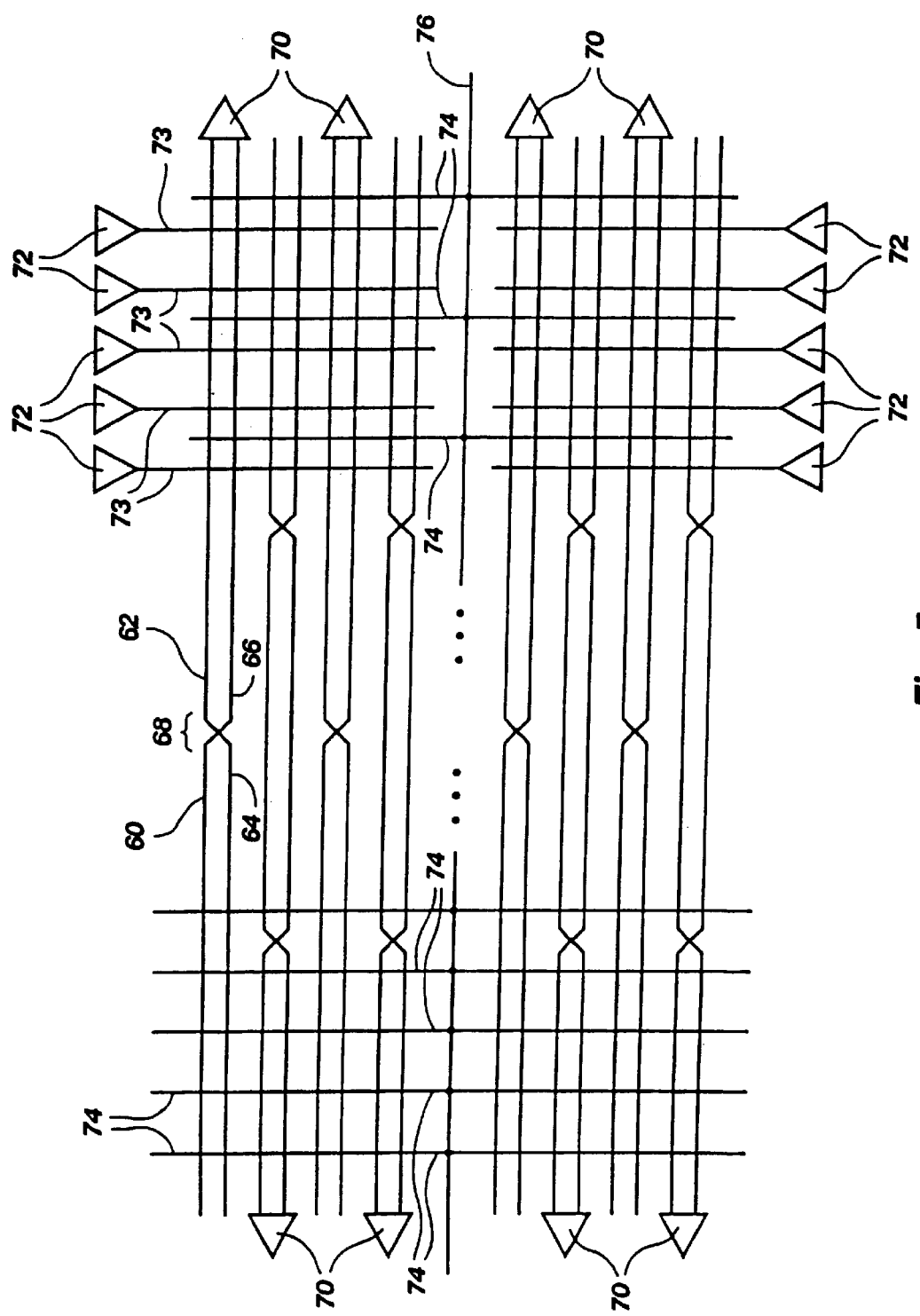
FIG. 5 is an oblique view of a portion of the memory array showing the location of the twists, sense amps, row decoders, and isolation devices.

Review of FIG. 5 illustrates a DRAM and an oblique view of two sections of the array utilizing the bi-level twist architecture. It is noted that, although there are two digit line pairs illustrated, they are in fact vertically oriented, one lying on top of the other. Additionally, the X 68 marks illustrate where the twisting takes place. It is noted that each line in each pair will spend 50% of the length located on the bottom of the vertical architecture. For example, upper line 60 switches to lower line 66 and lower line 64 moves up to the upper line 62. Of course, the appropriate memory cells will be located near the correct bit line sections to receive the information stored in the cells and feed that into the sense amps 70. An advantage with this architecture is that the row decoders 72, attached to the row lines 73, can be positioned on one side of the array. Additionally, the isolation lines 74 are also symmetrical per array and thus can share a common grounding node 76 located between the two arrays illustrated.

Figure 6:
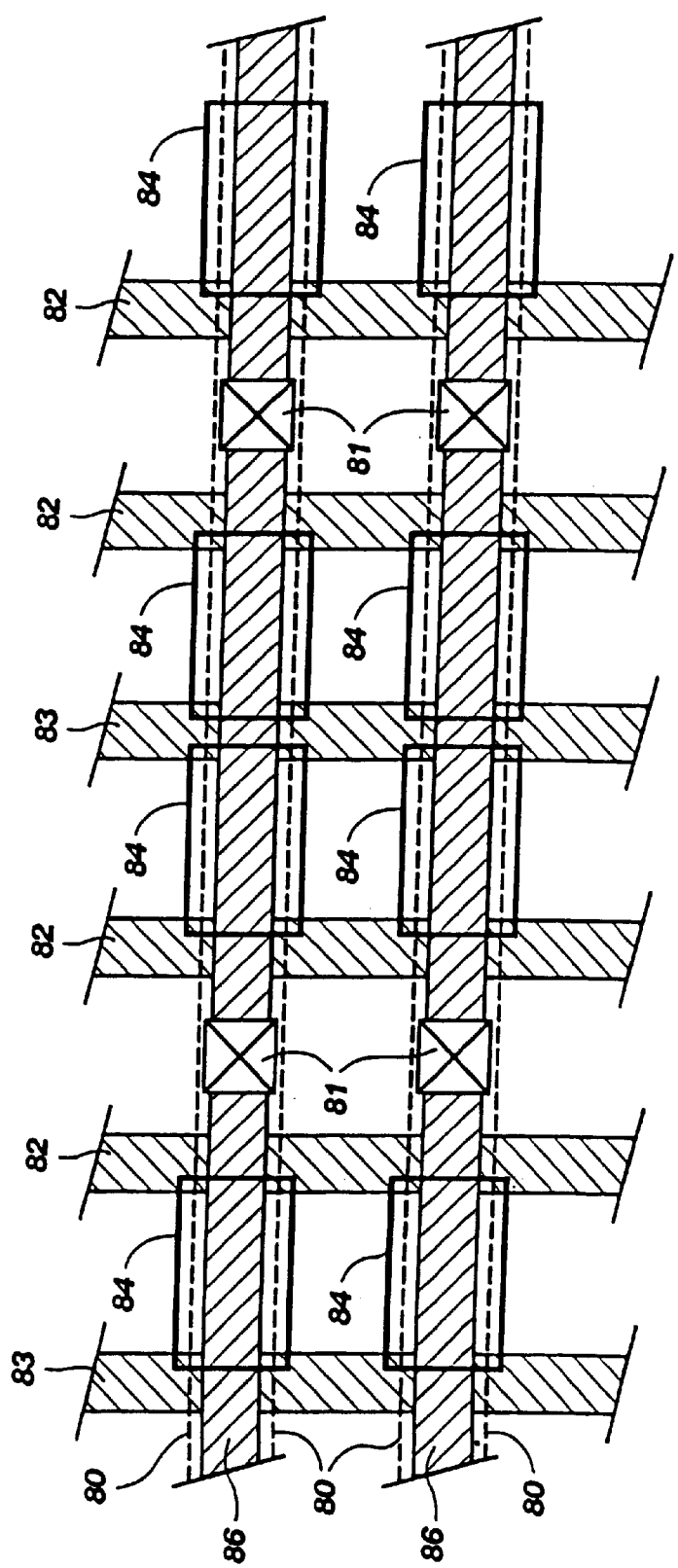
FIG. 6 is a representation of the layout of the present invention.

Attending to FIG. 6, there is an overview of a DRAM exhibiting eight memory cells 84 and the appropriate lines as illustrated. In particular, there is active area 80 running the length of bit lines 86 (though one line is shown, both the D and D* lines are vertically oriented). Word lines 82 will turn on the transistor to access the cells. Bit line contacts 81 will dump the cell charge onto the lower of the digit lines. Isolation gates/lines 83 keep the two adjacent memory cells from biasing each other.

Referring now to FIG. 7, a layout portion of a DRAM array having double-layer twisted digit lines is depicted. Six digit line pairs (DP0, DP1, DP2, DP3, DP4 and DP5) are shown in this abbreviated layout. It will be noted that in the depicted portion of the array, only digit line pairs DP0, DP2 and DP4 undergo a twist. Digit line pairs DP1, DP3 and DP5 are untwisted in this portion of the array. The alternating twist pattern not only provides for efficient reduction of capacitive coupling between adjacent digit line pairs, but it also provides room for the twisting operation. It will be noted that portions of first conductive strip S1 and second conductive strip S2 are vertically aligned with portions of adjacent digit line pairs. This is possible because first and second conductive strips S1 and S2 are not on a level with either of the adjacent double-layer digit lines. The memory cell layout to the right and left of the twist region 71 is similar to that depicted in FIG. 6. Vertical contact vias are represented by the squares marked with an "X". The interconnect pattern is similar to that depicted in FIG. 1. In FIG. 1, Level 2, the digit lines located on planes 12 and 14 would be used to interconnect the corresponding pairs of adjacent contact vias. For example, for digit line pair DP2, the digit line located on plane 14 would interconnect contact vias CV1 and CV2, while the digit line located on plane 12 would interconnect contact vias CV3 and CV4.

Remarks about the Invention

It is noted that the signal to noise ratios are kept acceptably low. The vertical arrangement and the crossing digit lines allow for equal top and bottom orientation and access to the appropriate memory cells. Additionally, the adjoining pair of digit lines is also switched appropriately to diminish signal to noise problems.

It is further noted that this array arrangement allows for the smaller cell sizes, for example, cells possible from the older open bit line architecture or any new six square feature area ($6F^2$) or smaller cell size, thus allowing smaller arrays using six square feature area ($6F^2$) to four square feature area ($4F^2$) cell sizes.

A still further advantage is the overall arrangement of the cells, bit lines, word lines, and isolation lines. All devices and lines are laid out to be exactly straight. There is no routing around the cells to open the gates like with the eight square feature area ($8F^2$) designs of the folded array structures.

Additionally, there is one sense amp (S-amp) located on one end of the digit and digit bar lines in an alternating pattern of the S-amp.

It is also noted that the twisting locations in the array are at quarter marks, either the first and third quarter, or at the halfway mark in the array. This allows for different digit line pair arrangements to be located next to each other.

Variations in the Invention

There are several obvious variations to the broad invention which thus come within the scope of the present invention. Uniquely, this invention may work with any positioning of the memory cells. Specifically, the cells may be located between, along side, on top, or underneath the bit lines, thus accommodating for trench, stacked, or elevated designs. One skilled in the art would have little trouble using the vertical bi-level bit line arrangement with these other DRAM designs.

Additionally, any layering can be used for the bi-level digit lines. Specifically, the bottom layer could be an implant in the substrate, or poly on top of the substrate, or any of the metals over the poly. It all depends on how high the chip design is stacked and where the memory cells are located.

Similarly, the twisting of the vertical digit lines can be located anywhere in the array, like over $\frac{1}{12}$ of the line. The only requirement is that half of the length of each digit line is located on top and half on the bottom of the vertical arrangement, although it is noted that any increase in the number of twists will increase the size of the array.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method for reducing differential noise in an integrated circuit memory device having a plurality of memory cells, comprising:

fabricating a first digit line having a width and a second digit line having a width, the first digit line and the second digit line extending in a first conductive level and a second conductive level above a plane extending along a portion of a surface of the integrated circuit memory device such that the first digit line and second digit line are substantially vertically aligned within the widths thereof and vertically stacked one from the other in the plane;

providing a vertical conductive twist to locate a portion of each of the first digit line and the second digit line in both the first conductive level and the second conductive level;

coupling an equal number of the plurality of memory cells of the integrated circuit memory device to portions of the first digit line and the second digit line located in a lower conductive level of the first conductive level and the second conductive level;

electrically balancing the first digit line and the second digit line when vertically stacked one atop the other; and isolating at least one pair of adjacent memory cells of the plurality of memory cells using an isolation transistor located in an isolation region.

2. The method of claim 1, further comprising:

isolating a plurality of adjacent memory cells of the plurality using an isolation region including isolation transistors, each isolation transistor having a gate biased to a predetermined voltage.

3. A method for differential noise reduction for an integrated circuit memory device having a plurality of memory cells, comprising:

fabricating a first digit line having a width and a second digit line having a width, the first digit line and the second digit line extending in a first conductive level and a second conductive level above a plane extending along a portion of a surface of the integrated circuit memory device such that the first digit line and second digit line are substantially vertically aligned within the widths thereof and vertically stacked one from the other in the plane;

providing a vertical conductive twist to locate a portion of each of the first digit line and the second digit line in both the first conductive level and the second conductive level;

coupling an equal number of the plurality of memory cells of the integrated circuit memory device to portions of the first digit line and the second digit line located in a lower conductive level of the first conductive level and the second conductive level;

electrically balancing the first digit line and the second digit line when vertically stacked one atop the other; and isolating at least one pair of adjacent memory cells of the plurality of memory cells using an isolation transistor located in an isolation region.

4. The method of claim 3, further comprising:

isolating a plurality of pairs of adjacent memory cells of the plurality using an isolation region including isolation transistors, each isolation transistor having a gate biased to a predetermined voltage.

5. A differential noise reduction method for an integrated circuit memory device having a plurality of memory cells, comprising:

fabricating a first digit line having a width and a second digit line having a width, the first digit line and the second digit line extending in a first conductive level and a second conductive level above a plane extending along a portion of a surface of an integrated circuit memory device such that the first digit line and second digit line are substantially vertically aligned within the widths thereof and vertically stacked one from the other in the plane;

providing a vertical conductive twist to locate a portion of each of the first digit line and the second digit line in both the first conductive level and the second conductive level;

coupling an equal number of the plurality of memory cells of the integrated circuit memory device to portions of the first digit line and the second digit line located in a lower conductive level of the first conductive level and the second conductive level;

electrically balancing the first digit line and the second digit line when vertically stacked one atop the other; and isolating at least one pair of adjacent memory cells of the plurality of memory cells using an isolation transistor located in an isolation region.

6. The method of claim 5, further comprising:

isolating a plurality of pairs of adjacent memory cells of the plurality using an isolation region including isolation transistors, each isolation transistor having a gate biased to a predetermined voltage.

7. A noise reduction method for a memory device having a plurality of memory cells, comprising:

fabricating a first digit line having a width and a second digit line having a width, the first digit line and the second digit line extending in a first conductive level and a second conductive level above a plane extending along a portion of a surface of the memory device such that the first digit line and second digit line are substantially vertically aligned within the widths thereof and vertically stacked one from the other in the plane;

providing a vertical conductive twist to locate a portion of each of the first digit line and the second digit line in both the first conductive level and the second conductive level;

coupling an equal number of the plurality of memory cells of the memory device to portions of the first digit line and the second digit line located in a lower conductive level of the first conductive level and the second conductive level;

electrically balancing the first digit line and the second digit line when vertically stacked one atop the other; and isolating at least one pair of adjacent memory cells of the plurality of memory cells using an isolation transistor located in an isolation region.

8. The method of claim 7, further comprising:

isolating a plurality of adjacent memory cells of the plurality using an isolation region including isolation transistors, each isolation transistor having a gate biased to a predetermined voltage.

* * * * *

UNITED STATES PATENT AND TRADEMARK OFFICE
CERTIFICATE OF CORRECTION

PATENT NO. : 6,567,288 B2  Page 1 of 2
APPLICATION NO. : 10/155132
DATED : May 20, 2003
INVENTOR(S) : Brent Keeth It is certified that error appears in the above-identified patent and that said Letters Patent is hereby corrected as shown below:

In the drawings:
In FIG 4:  Change the lowermost occurrence of "LEVEL 3" located on plane 50 to --LEVEL 4-- and delete reference numeral "36" and its corresponding lead line from LEVEL 2 digit bar D

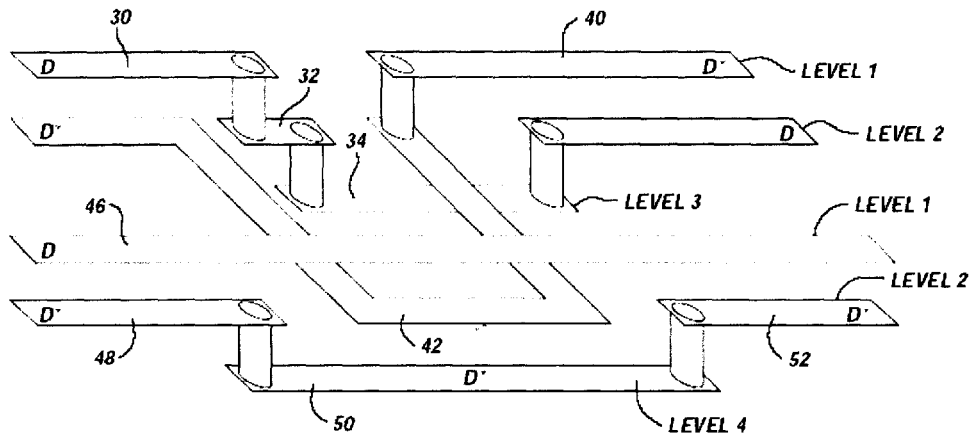

Fig. 4

In the specification:

| | | |
|---|---|---|
| COLUMN 1, | LINE 26, | change "x or y axis)" to --x- or y-axis)-- |
| COLUMN 1, | LINE 44, | change "poorer" to --poor-- |
| COLUMN 2, | LINE 11, | change "double decker" to --double-decker-- |
| COLUMN 3, | LINE 55, | change "DPO" to --DP0-- |
| COLUMN 3, | LINE 65, | change "DPO" to --DP0-- |
| COLUMN 4, | LINE 22, | change "the figure," to --FIG. 1,-- |
| COLUMN 4, | LINE 24, | change ""plane 12")." to --"second plane 12").-- |

UNITED STATES PATENT AND TRADEMARK OFFICE
CERTIFICATE OF CORRECTION

PATENT NO. : 6,567,288 B2
APPLICATION NO. : 10/155132
DATED : May 20, 2003
INVENTOR(S) : Brent Keeth It is certified that error appears in the above-identified patent and that said Letters Patent is hereby corrected as shown below:

COLUMN 4, LINE 38, change "levels" to --planes--
COLUMN 4, LINE 58, delete "and 36"
COLUMN 4, LINES 58-59, change "42 to 40." to --42 and 40.--

Signed and Sealed this

Twenty-sixth Day of September, 2006

JON W. DUDAS
*Director of the United States Patent and Trademark Office*